United States Patent [19]
Liebmann et al.

[11] Patent Number: 6,057,063
[45] Date of Patent: *May 2, 2000

[54] PHASE SHIFTED MASK DESIGN SYSTEM, PHASE SHIFTED MASK AND VLSI CIRCUIT DEVICES MANUFACTURED THEREWITH

[75] Inventors: Lars W. Liebmann, Poughquag; Ioana C. Graur, Poughkeepsie, both of N.Y.; Young O. Kim, San Jose, Calif.; Mark A. Lavin, Katonah; Alfred K. Wong, Beacon, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/824,700

[22] Filed: Apr. 14, 1997

[51] Int. Cl.$^7$ .................................................. G03F 9/00

[52] U.S. Cl. .................................................... 430/5

[58] Field of Search .................................... 430/5

[56] References Cited

U.S. PATENT DOCUMENTS

| | | | |
|---|---|---|---|
| 5,246,800 | 9/1993 | Muray | 430/5 |
| 5,481,473 | 1/1996 | Kim et al. | 364/490 |
| 5,497,334 | 3/1996 | Russell et al. | 364/489 |
| 5,537,648 | 7/1996 | Liebmann et al. | 395/500 |
| 5,573,890 | 11/1996 | Spence | 430/311 |
| 5,681,674 | 10/1997 | Fujimoto | 430/5 |
| 5,702,848 | 12/1997 | Spence | 430/5 |
| 5,766,804 | 6/1998 | Spence | 430/5 |
| 5,766,806 | 6/1998 | Spence | 430/5 |

OTHER PUBLICATIONS

Waas, T., et al., "Automatic Generation of Phase Shift Mask Layouts", *Microelectronic Engineering*, 23 (1994), pp. 139–142.

Ooi, K., et al., "Computer Aided Design Software for Designing Phase–Shifting Masks", *Jpn. J. Appl. Phys.*, vol. 32, No. 12B, 1993, Pt. 1, pp. 5887–5891.

Onodera, T., et al., "Conjugate Twin–Shifter Phase Shift Method for High Resolution Lithography", *OIC Technical Review 148*, vol. 49, Dec. 1993, pp. 47–50.

Marc D. Levenson, "Phase–Shifting Mask Strategies: Isolated Dark Lines", *Microlithography World*, Mar./Apr. 1992, pp. 6–12.

Terasawa, T., et al., "Variable Phase–Shift Mask for Deep Sub–Micron Optical Lithography", *SPIE*, vol. 1463 Optical/Laser Microlithography IV (1991), pp. 197–206.

*Primary Examiner*—Nam Nguyen
*Assistant Examiner*—Steven H. Ver Steeg
*Attorney, Agent, or Firm*—Pollock, Vande Sande & Amernick

[57] ABSTRACT

A process for creating and verifying a design of phase-shifted masks utilizing at least one phase shift region employing a computer-aided design system. A chip design is provided. A phase-shift mask design capable of producing the chip design is created. Features in a design of the phase-shifted mask that require phase shifting are located. Uncolored phase regions are created on opposite sides of the features. Proper phase termination of the phase regions is ensured based upon space constraints of a phase-shifted mask technique utilized. Phases are determined for the phase regions. Whether coloring errors and un-phase-shiftable design features exist is determined. Mask process specific overlaps and expansions are applied to the mask design to prepare designed data levels for mask manufacture. A residual phase edge image removal design is derived.

32 Claims, 10 Drawing Sheets

PHASE SHIFTED MASK DESIGN SYSTEM, PHASE SHIFTED MASK AND VLSI CIRCUIT DEVICES MANUFACTURED THEREWITH

FIELD OF THE INVENTION

The present invention relates to the manufacture of very large scale integrated (VLSI) circuit devices and their manufacture. In particular, the present invention provides a method and apparatus for converting a chip design into a phase-shifted mask design for producing the chip.

BACKGROUND OF THE INVENTION

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R of an optical projection system such as a lithography stepper is limited by parameters described in Raleigh's equation:

$$R = k \, \lambda/NA$$

Where $\lambda$ represents the wavelength of the light source used in the projection system and NA represents the numerical aperture of the projection optics used. k represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm wavelengths, but mid ultra violet (MUV) steppers with a wavelength of 356 nm are also in widespread use.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which allows developer to dissolve and remove the resist in the exposed areas. (Negative resist systems allow only unexposed resist to be developed away.) The photo masks, when illuminated, can be pictured as an array of individual, infinitely small light sources which can be either turned on (points in clear areas) or turned off (points covered by chome). If the amplitude of the electric field vector which describes the light radiated by these individual light sources is mapped across a cross section of the mask, a step function will be plotted reflecting the two possible states that each point on the mask can be found (light on, light off).

The conventional photo masks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effect will cause images to exhibit a finite image slope. At small dimensions, that is, when the size and spacing of the images to be printed are small relative to the $\lambda/NA$, electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is, the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size. Phase shifted mask (PSM) lithography improves the lithographic process latitude or allows operation at a lower K value (see equation 1) by introducing a third parameter on the mask. The electric field vector, like any vector quantity, has a magnitude and direction, so, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks with be 180° out of phase; that is, their electric field vector will be of equal magnitude but point in exactly opposite directions so that any interaction between these light beams results in perfect cancellation. For more information on PSMs, please see "Phase-Shifting Mask Strategies: Isolated Dark Lines", Mark D. Levenson, Microlithography World, March/April 1992, pp. 6–12, the entire contents of which are hereby incorporated by reference.

Even though resolution enhancement through the use of hard phase shifted masks (frequency doubling masks) has been extensively proven, implementation of this technique is critically dependent on computer assisted (CAD) technology that can modify existing circuit designs to incorporate the additional design levels needed to build a phase shifted mask. Design modifications consist of defining regions on the mask that require phase shifting (i.e., by etching into the mask substrate) relative to the rest of the mask, and of creating shapes that are to eliminate lines printed by unwanted phase edges. The basic concept of creating a phase transition across any small feature is easily realized and can be done, given sufficient time, on a graphics terminal by hand. The challenge that needs to be met before introducing hard phase shifters to VLSI product programs lies in the rapid, reliable design modifications of complex chip designs.

Residual phase edges in a standard two phase (0° and 180° phases) layout have to be removed either by a phase gradient approach or by use of a trim mask. Phase gradient approaches use a significant amount of space and gravely impact layout density. Trim mask approaches require two exposures for every conventional exposure field. This is extremely costly in a manufacturing environment.

Standard alternating PSMs using only two phase regions yield asymmetric intensity profiles which can cause a skew in the image and reduction in process latitude.

Alternating PSMs using either a deposited shifter material or a quartz etch process, are very susceptible to 180° phase defects which cannot be repaired with state of the art repair tools, are extremely elusive to existing inspection tools, yet have significant impact on printed wafer images.

Asymmetric frequency doubling PSMs (alternating or phase edge) are very difficult to design even when requiring only two distinct phase regions.

Compactor based design systems are only applicable to dark field PSM designs and cannot be used for the design of bright field PSMs such as the ones required for logic gate levels.

Inverse problem methods of PSM design are extremely computational intensive and have not been demonstrated to be feasible for actual chip designs.

Router based PSM design tools cannot be modified to handle the task of designing PSMs with multiple (more than two) phase regions since the premise of the router concept is to form a single phase polygon using the existing chrome designs as sides to the polygon. So the resulting mask layout can only consist of a single phase region, the mask background, and the chrome features, allowing for only two phase assignments.

SUMMARY OF THE INVENTION

In view of the above, the inventors of the present invention sought to develop a system for converting the chip design to a phase-shifted mask layout.

It is an object of the present invention to provide an algorithm for the generation of a phase-shifted mask design based, at least in part, upon feature edges.

Another object of the present invention is to provide a method and apparatus for efficiently designing regions to be phase shifted and assigning phases to the regions, thereby generating phase-shift mask designs from full scale chip layouts.

A further object of the present invention is to provide a method and apparatus for designing alternating phase-shifted masks with three phase regions.

In view of these and other objects, the present invention provides a method for generating a phase-shift mask design that includes providing a chip design to be manufactured with the phase-shift mask. Features on the chip that require a phase-shifted portion of the mask are located. Phase-shifted regions on opposite sides of the features are created on the mask. Proper phase termination of the phase regions is then ensured, based upon space constraints of a phase-shifted mask technique to be utilized with the mask. The phases are then determined for the phase-shifted regions. The mask design is analyzed to determine whether coloring errors and unphaseshiftable design features exist. Mask process specific overlaps and expansions are then applied to prepare design datalevels for mask manufacture. A residual phase edge image removal design is then derived.

According to other preferred aspects, the present invention provides a process for creating and verifying a design of phase-shifted masks utilizing at least one phase-shifted region. The process employs a computer aided design system. The process determines feature edges of a structure to be created by the mask that will require phase-shifting based upon the width of the feature relative to the resolution of the exposure tool utilized with the mask. Edges of the features are projected outwardly by a predetermined amount to derive a set of colorless phase regions. Fill shapes are created to occupy gaps smaller than a predetermined width between phase regions on the mask that are not over chrome or between phase regions and neighboring non-critical chrome features. Phases are then assigned to the phase regions.

According to further preferred aspects, the present invention provides a process for creating a dark field alternating phase shifted mask. The process includes identifying features in the mask that require phase-shifting. Generic phase regions are created on opposite sides of the features requiring phase-shifting. Phases are assigned to the generic phase regions utilizing a net coloring approach and based upon minimum steppage between features. Proper phase termination of all phase regions is ensured. Designed datalevels are prepared for mask manufacturing by applying mask process specific overlaps and expansions.

The present invention also includes phase-shifted masks prepared according to the processes of the present invention and semiconductor chip devices created utilizing phase-shifted masks prepared according to the process of the present invention.

Still other objects and advantages of the present invention will become readily apparent to those skilled in the art from the following detailed description. The detailed description shows and describes only preferred embodiments of the invention so as to illustrate the best mode contemplated of carrying out the invention. As those skilled in the art will realize, the invention includes other and different embodiments. Details of the invention may be modified in various respects, without departing from the invention. Accordingly, the drawings and description should be regarded as illustrative in nature and not restrictive.

DETAILED DESCRIPTION OF THE INVENTION

As discussed above, the present invention provides methods for efficiently and accurately converting a binary chip design into a phase-shifted mask layout. The invention also relates to the masks themselves and the circuits that may be produced utilizing the masks.

It is useful in the manufacture of very large scale integrated (VLSI) circuit devices and for resolution enhancement of photolithographic images formed utilizing phase-shifted masks. The present invention may be utilized to create mask designs having multiple distinct phase-shifted regions on the mask in addition to opaque chrome regions.

The present invention may be utilized in forming dark field as well as bright field phase-shifted masks. Additionally, the present invention may be utilized to form phase-shifted masks having two phases, 0° and 180°, phase-shifted masks including two phases and a separate trim mask, phase-shifted masks with intermediate phase steps at undesired 0°/180° phase interfaces, and phase-shifted masks known as conjugate twin-shifter phase-shifted masks that employ up to three independent phases to achieve the desired resolution enhancement while creating a circuit design without requiring a residual phase edge removal technique. However, as will become apparent from the discussion herein, the present invention may be utilized in forming other phase-shifted mask designs as well.

Figure 1:
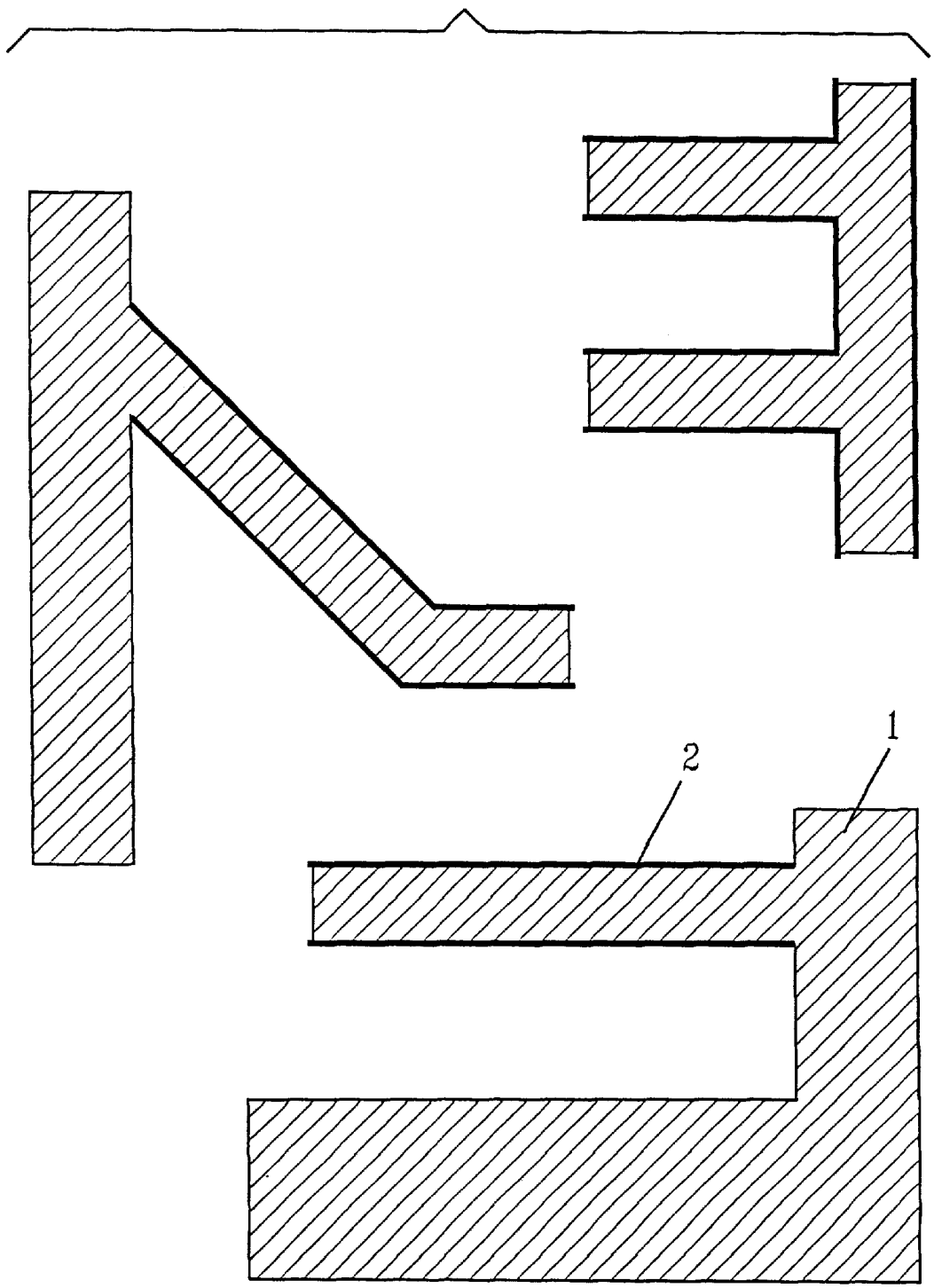
FIG. 1 represents a plan view of a mask design showing feature edges defining portions of the design that require phase-shifting based upon the width of the feature relative to the resolution of the exposure system being utilized to produce a corresponding circuit design.
Figure 2:
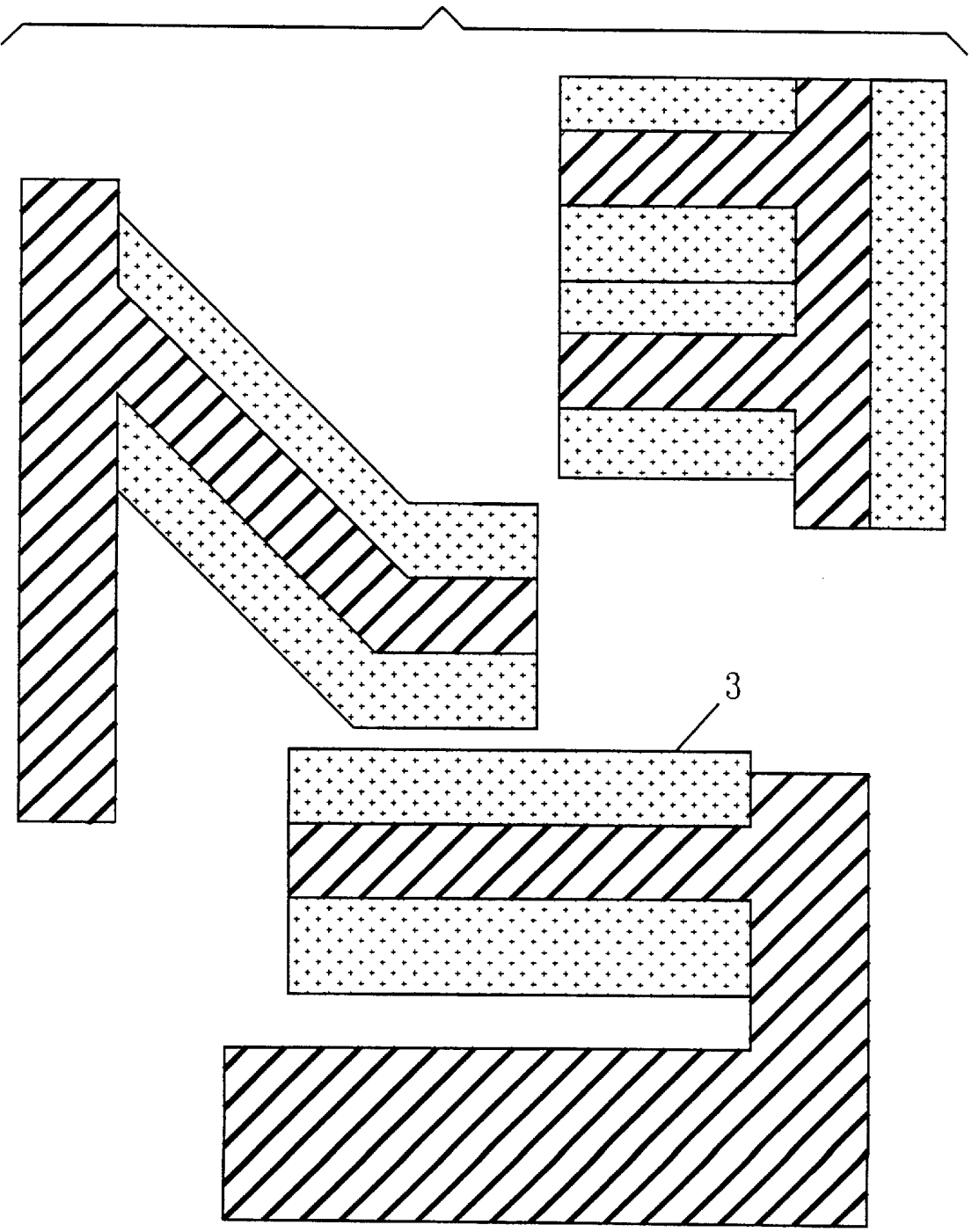
FIG. 2 shows a plan view of a mask design showing the provision of generic, colorless phase shapes outwardly projected from the feature edges shown in FIG. 1.

Broadly defined, methods of the present invention include locating features 1, shown in FIG. 1, in a given circuit design, designed by edges 2, that will require phase shifting. Generic phase regions 3, shown in FIG. 2, are created on each side of the circuit features. Proper termination of the phase regions is ensured. The phase regions are then assigned phases. Errors in the assignment of phases and unphaseshiftable design features are located and eliminated or otherwise dealt with. Design datalevels for mask manufacturing are prepared. A residual phase edge removal design is derived.

The design process of the present invention may be utilized with a variety of phase-shifted masks. For example, the invention may be utilized for designing a highly complex bright field conjugate twin-shifter phase shift mask. Additionally, the present invention may be utilized to produce a standard 0°/180° phase-shift mask including either a separate trim mask or an intermediate phase step or steps to hide residual phase edges. Furthermore, the present invention may be utilized to create dark field alternating phase-shift masks. However, the present invention may be utilized to form any number of phase shifted masks not specifically named herein.

An illustrative example of the present invention will be described with respect to conjugate twin-shifter phase-shift masks. In a conjugate twin-shifter phase-shift mask, critical dimension chrome features are bordered by a 90° phase region on one side and a 270° phase region on the other. The background of the mask is left at 0° phase.

A conjugate twin-shifter mask results in a 180° shift in phase across a desired feature. Such a shift provides the conjugate twin-shifter mask with all of the benefits of phase-shifted mask lithography. However, residual phase edges only constitute a 90° phase shift. With proper process control, a 90° phase shift requires no special removal or prevention processes. Since both sides of the critical dimension feature in a conjugate twin-shifter phase shift mask are phase modified, the asymmetry of the resulting intensity profile is significantly reduced. As a result of the above process, a resolution enhancing phase shift across a desired feature is created on the conjugate twin-shifter phase shift mask by creating a 90° phase region on one side and a separate 270° phase region on the opposite side. Since neither the etch nor deposition involved in the mask process involves a 180° operation, chances of creating 180° phase defects are vastly reduced.

As stated above, a conjugate twin-shifter phase-shift mask, includes two phase regions. Theoretically, the two phase regions may be selected according to the following formulas:

$$\text{phase } 1 = n \times 90°$$
$$\text{phase } 2 = (n+2) \times 90°,$$

where n represents any odd integer. In the most commonly utilized conjugate twin-shifter phase-shift mask, the two phases are 90 and 270.

In spite of the inherent advantages of a conjugate twin-shifter phase shift mask, such masks have not been implemented on real chip designs due to the overwhelming complexity of the design task. The present invention provides a computer aided design system capable of creating and verifying the design of a phase-shifted mask using multiple separate phase regions in addition to chrome regions. The method of the present invention illustrated below relates to designing a bright field conjugate twin-shifter phase shift mask. Such a design is one of the most applicable phase shift masks for integrated circuit manufacturing yet one of the most challenging to design.

A method for designing such a mask according to the present invention includes locating feature edges in the mask design that define portions of the design that will require phase shifting based upon the width of the feature relative to the resolution of the exposure tool. The features that require phase shifting are located based upon their size. Typically, the features requiring phase shifting are determined relative to resolution. For example, referring to Raleigh's equation above, features having dimensions where k is less than about 0.6 may require phase shifting. Edges, or a line connecting two vertices or corners in a design, that form regions where k is less than about 0.6 may require phase shifting. However, the size may vary depending upon the exposure device utilized, wavelength, and other factors.

Once the feature edges have been located, the process of the present invention derives a preliminary set of generic or colorless phase shapes by outwardly projecting the feature edges by a typical amount. Generic phase regions are regions in the design that, due to their vicinity to a critical dimension feature, are known to require phase shifting, and, hence, phase assignment. When generic phase regions are identified, it is not clear what phase will be assigned to the regions during a "coloring" procedure, where the phase will be shifted according to the applicable process the desired amount. Generating the generic phase regions function to establish spatial outlines of a phase design.

Generic phase regions may initially be formed by expanding, or projecting, edges of critical dimension features into polygons. This helps to ensure that every critical dimension feature has a phase region on either side of it. The "coloring", described below in greater detail, then creates the "phase transition" or phase change across the critical dimension features by assigning and creating regions of different phase on either side of the critical dimension feature.

The amount that the feature edges may be projected outwardly may vary depending upon the particular embodiment. According to one embodiment, the feature edges are projected outward by an amount defined by the following formula:

$$k \times \lambda / NA.$$

In this formula, $\lambda$ represents the wavelength of the radiation used to expose the material, such as photoresist, in forming the particular structure involved. NA represents the numerical aperture of the projection optics utilized in the system transmitting the radiation to the mask and the structure being created k is as previously defined with a value of from about 0.5 to about 0.8, less than about 0.6 or from about 0.5 to about 1.

According to other embodiments, the phase shapes may be projected outwardly by a different amount. Typically, the phase shapes may be projected out by an amount of from about $0.5\lambda/NA$ to about $1\lambda/NA$.

A light field mask includes opaque chrome features in a clear background. The phase shift mask design of a light field mask preferably includes initially designing areas within the general mask background that will need to have a phase assigned to them. The edges are then projected outwardly.

On the other hand, a dark field mask generally includes clear hole patterns in an opaque background. With dark field masks, the phase shift mask design includes assigning a phase to existing design features. Dark field phase shift mask design does not require shape generation, such as by projecting edges, since the shapes that will be assigned a phase already exist in the form of the circuit design patterns.

The next step according to the process of the present invention is to ensure that all edges of the previously-identified generic colorless phase regions terminate either on chrome or have sufficient width of un-phaseshifted region adjacent to them to minimize the transmission reduction at the residual phase edge, by creating fill shapes to occupy gaps of smaller specified width. The shapes of the fill shapes typically are based upon the gap that needs filling. Preferably, the transmission reduction is no greater than about 50%.

Generally, two types of phase terminations exist. In the first type, a phase region can terminate on chrome, that is, on an opaque feature. In this case, proper termination means that the phase shifted region cleanly butts up to a chrome structure, with no gap between the phase shift region and the chrome feature.

In the second type of phase termination, a phase region can terminate in a clear region, that is, a transparent region. In this second type, defining proper phase termination is largely dependent upon a specific phase shift mask technique utilized and on process assumptions, such as overlay accuracy and resolution, made.

For phase shift masks utilizing 0° and 180° phase shift regions, and a separate trim mask to erase residual phase edges, the distance between a residual phase edge, that is, a phase edge that does not land on chrome, and other design features of the mask preferably equals (0.5 width of the trim pattern)+(the tolerance in the width of the trim pattern)+(the overlay error of the trim pattern to the phase pattern)+(buffer zone to prevent incoherent adding of the trim and desired phase shift mask patterns). In a "worst case scenario", the edge placement of a trim pattern and an edge of a desired pattern, numerically, the distance will equal about $[0.5\times0.6(\lambda/NA)]+[10\%\times0.5\times0.6(\lambda/NA)]+[40\%\times0.5(\lambda/NA)]+[0.4(\lambda/NA)]$.

In an embodiment of a conjugate twin shifter phase shift mask utilizing 90° and 270° phase regions to form the phase transition, residual phase edges may have to be separated far enough to provide enough 0° phase area between them to prevent a phase interaction that could cause an unwanted dark line on the wafer. Numerically, this distance is about $0.5(\lambda/NA)$.

Figure 11:
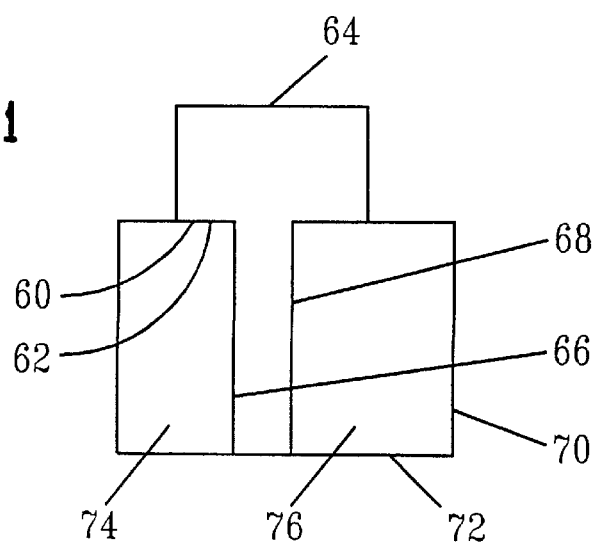
FIG. 11 represents a cross-sectional view of a portion of a light field phase shift mask design showing an embodiment of a phase edge termination.

The termination of the phase edges on chrome may either be a desired phase edge or a hidden phase edge. The hidden phase edge 60 may include a phase edge landing 62 on a large chrome feature 64. FIG. 11 illustrates termination of phase edges in this manner. FIG. 11 also shows desired edges 66 and 68 and residual edges 70 and 72. The phase shifted regions 74 and 76 in the embodiment shown in FIG. 11 are shifted 90° and 270°, respectively.

In cases where the edges of the phase regions have sufficient width of un-phase shifted region, such as about $0.5\lambda/NA$, adjacent to them. The gaps typically have a width smaller than an amount defined by the following formula:

$$0.5 \times \lambda / NA.$$

In this formula, $\lambda$ represents the wavelength of the radiation used to expose the material, such as photoresist, in forming the particular structure involved. NA represents the numerical aperture of the projection object utilized in the system transmitting the radiation to the mask and the structure being created.

Figure 3:
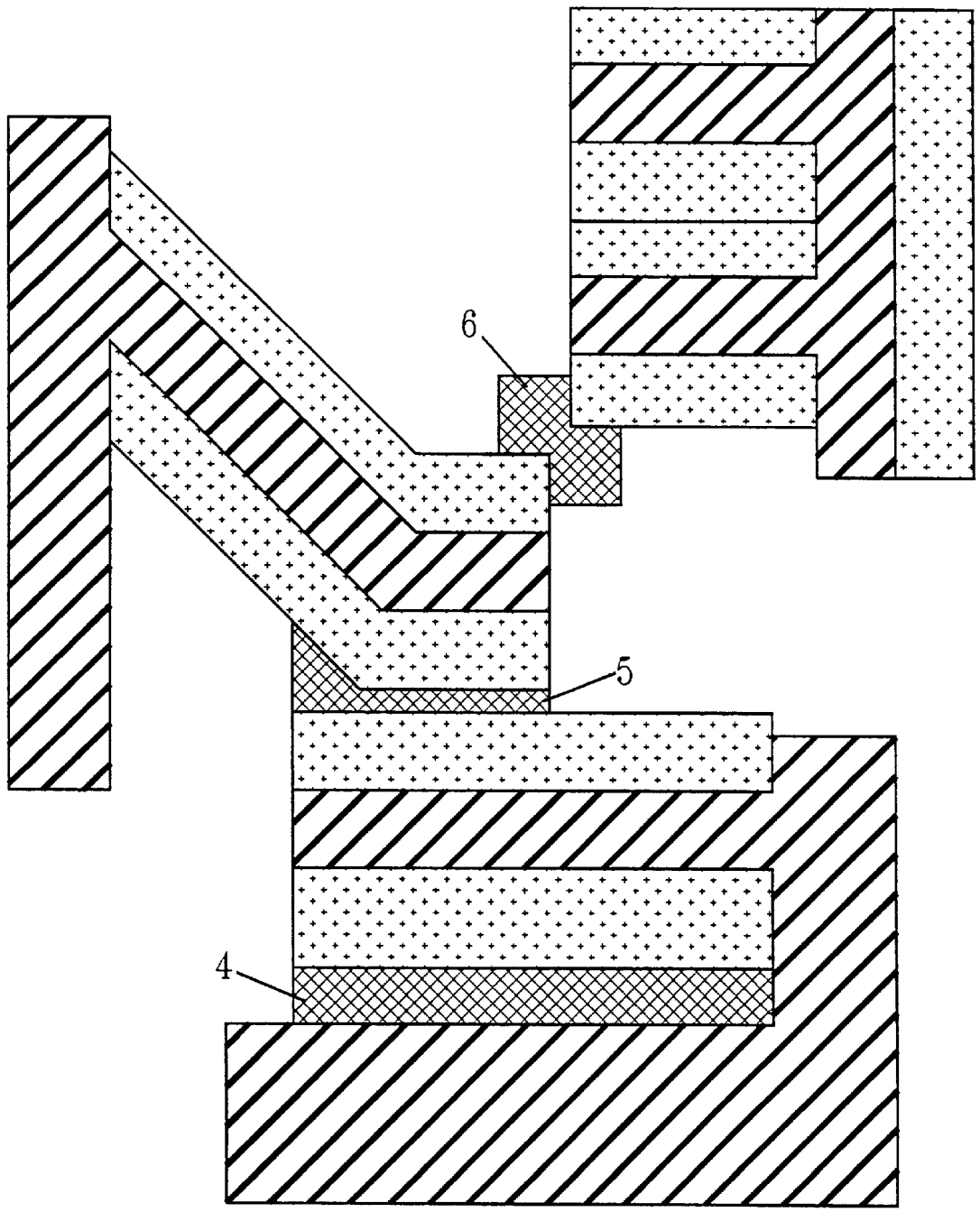
FIG. 3 represents a plan view of a mask design showing edge termination of the phase-shifted regions shown in FIG. 2 on chrome or with sufficient distance between a phase-shifted region to minimize transmission reduction at the phase edge.

FIG. 3 illustrates one embodiment of how the present invention deals with the edges of the phase regions. The cross-hatched areas 5 and 6 shown in FIG. 3 represent spaces between phase regions 3, while the cross-hatched area 4 represents a space between a phase shifted region 3, 7 and a chrome feature 1 of non-critical dimension. As shown in FIG. 3, acceptable phase edge terminations are formed by edges on the phase regions that terminate on chrome, or have sufficient width of un-phase shifted region adjacent to them to minimize transmission reduction at residual phase edges. Violations of these edge conditions are resolved by creating fill shapes to occupy gaps of smaller than specified widths between phase regions not over chrome as represented by region 11 and 14 in FIG. 4 and between phase regions and neighboring non-critical chrome features represented by region 10 in FIG. 4.

Preferably, once the generic colorless phase shapes have been outwardly projected from the feature edges and the edges of the phase regions, the present invention assigns appropriate phases to the designed colorless regions and the edge termination regions by forcing phase regions that touch or approach each other within a minimum space to assume the same phase. According to one embodiment, the minimum space may be touching to one or two design grids.

On the other hand, phase regions that are on opposite sides of the critical dimension regions that require phase shifting are forced to have the opposite phase. In the case of a conjugate twin-shifter phase shift mask, the phase regions on opposite sides of the critical dimension structure are provided with 90° and 270° phase. Alternatively, the assigned phases may be about n(90°) and (n+2)(90)°.

Once the present invention assigns phases to the regions that require phase-shifting, preferably, the invention reviews the design to detect errors where phase areas will occur and/or where appropriate conditions cannot be met. An example of where conditions cannot be met occurs with phase regions of the same phase on opposite sides of features of critical dimensions.

Figure 5:
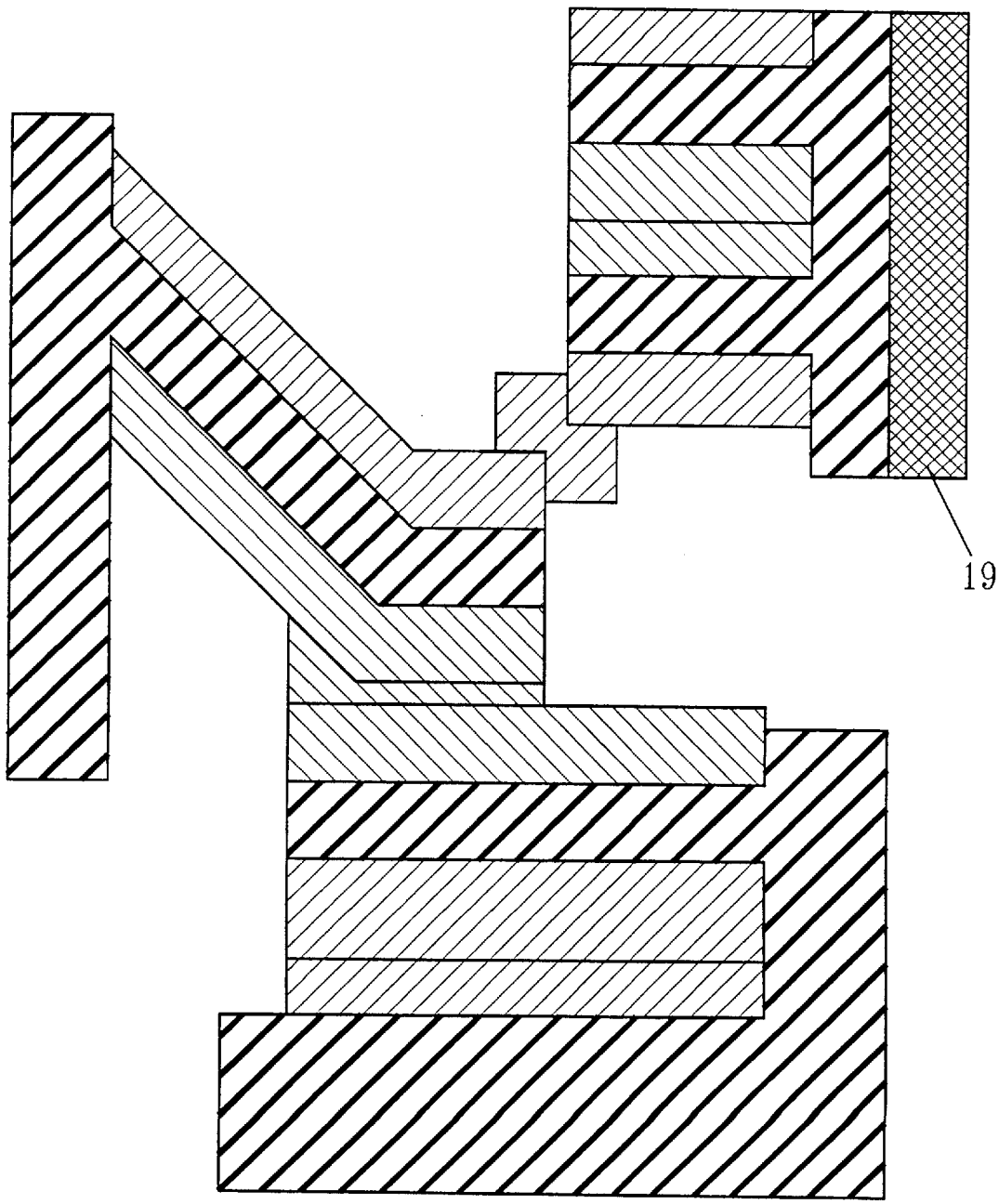
FIG. 5 represents a plan view of the mask design shown in FIGS. 1–4 showing areas where appropriate conditions cannot be met.

FIG. 5 illustrates the identification of the phase errors. In particular, area 19 shown in FIG. 5 represents an area. This area can not be colored, or provided with a phase shift, to ensure that every phase region only has one phase and every feature of critical dimension sees a phase transition across the feature.

Once the areas where phase errors will occur have been identified and dealt with, the present invention finalizes the output of the mask by overlapping the phase regions onto the chrome regions as required for the mask house process. The mask house process is the process by which the CAD data is turned into the physical photo mask structure. The amount of overlap depends upon the predicted overlap error between phase regions and the chrome on the mask.

Figure 4:
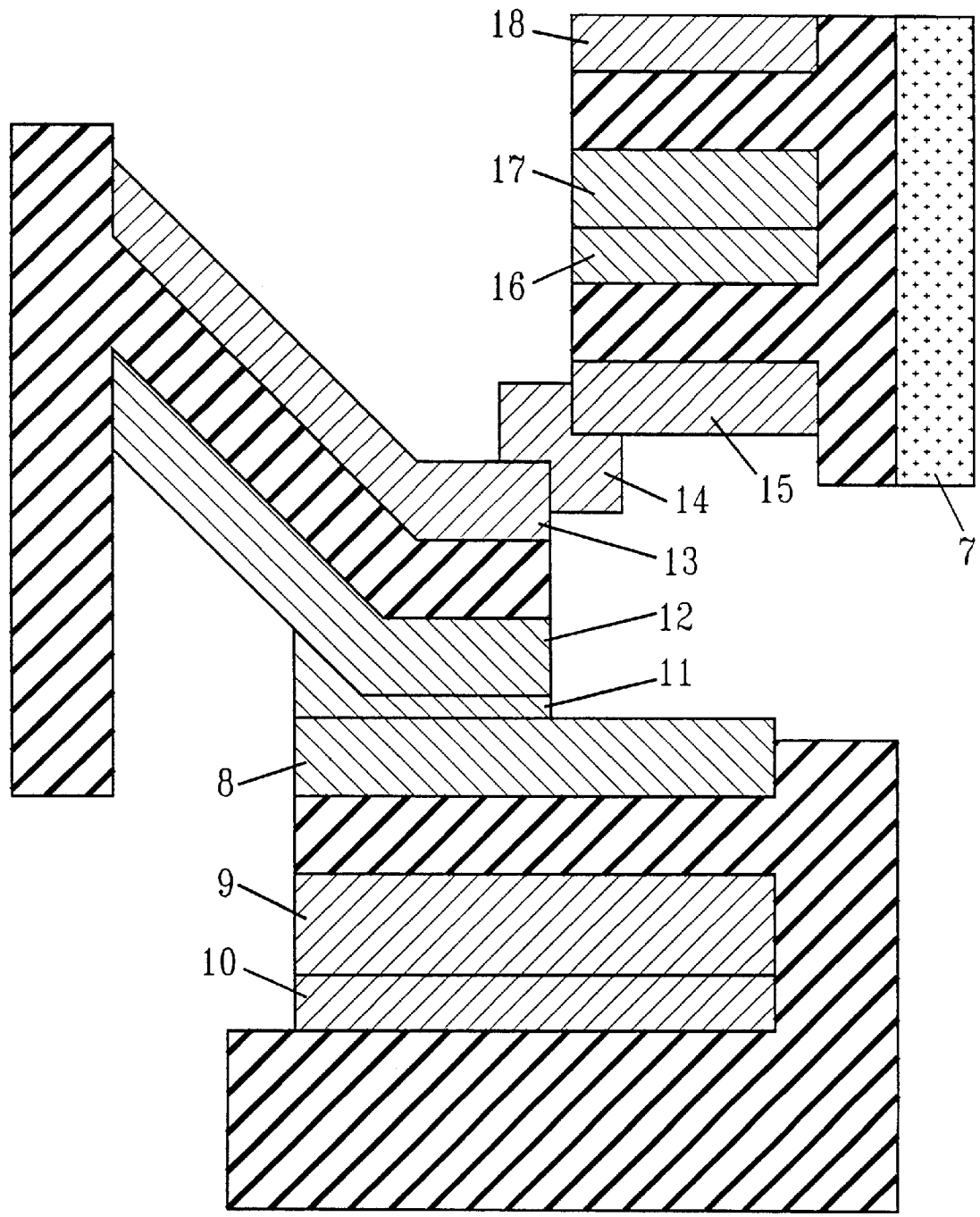
FIG. 4 represents a plan view of the mask design shown in FIGS. 1–wherein appropriate phases have been assigned to the phase-shifted regions adjacent the critical features and the edges of the phase regions.
Figure 6:
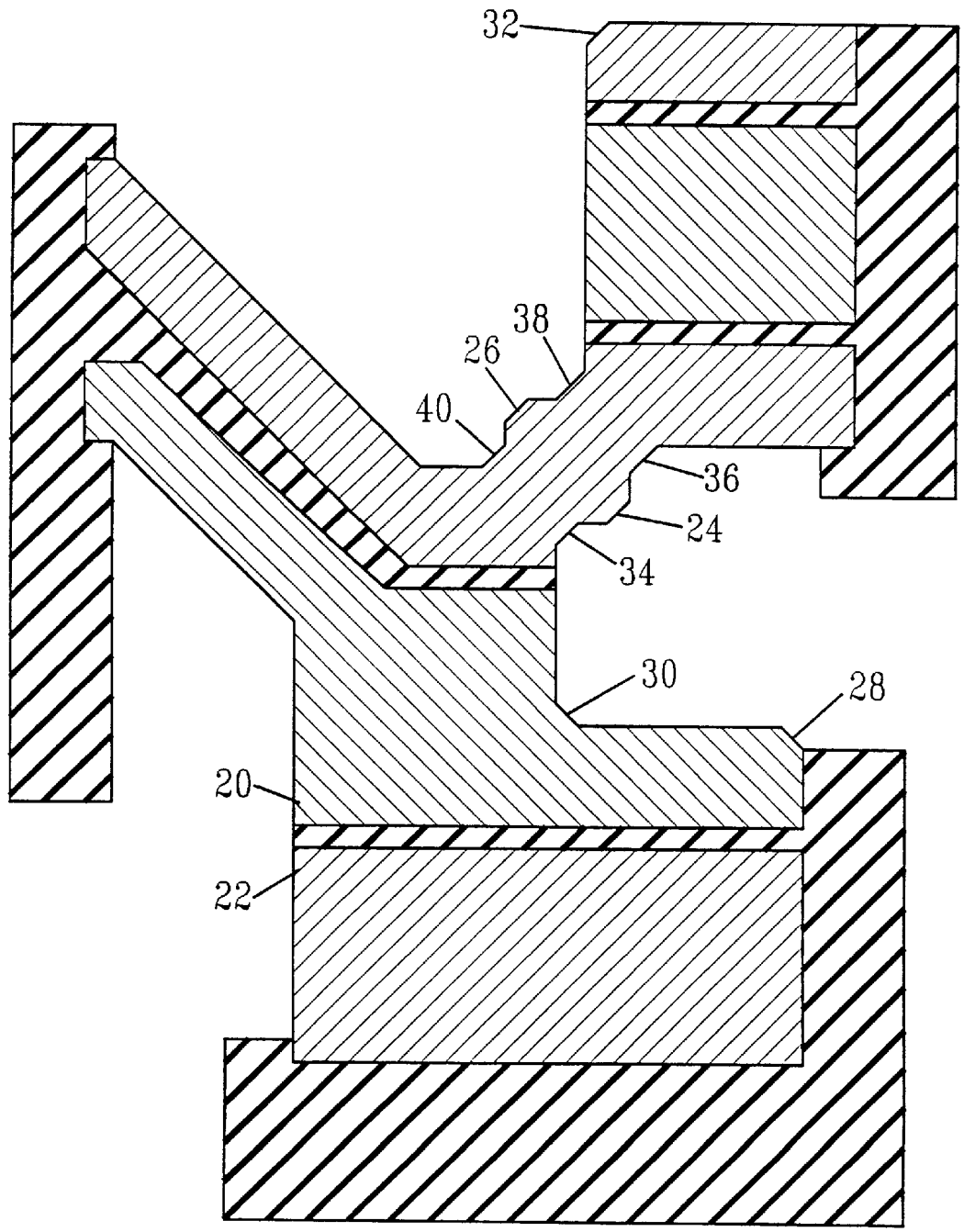
FIG. 6 shows a plan view of the mask design shown in FIGS. 1–5 wherein the mask design has been widened to avoid the error conditions identified in FIG. 5, and wherein the phase shifted regions have been overlapped onto chrome regions, as necessary, and square corners have been tapered.

FIG. 6 illustrates the overlapping of the phase areas onto the chrome areas as exemplified by the areas 20 and 22. In comparison, FIGS. 4 and 5 show areas 8, 9, 12, 13, 15, 16, 17, and 18 of the phase shifted areas before overlapping onto the chrome regions.

At this stage in the process, the present invention also manipulates the residual phase edges as called for by the exposure process. Such manipulation includes tapering square corners and residual phase edges to prevent abnormalities in conditions where the image is out of focus. The tapering of 30, 32, 34, 36, 38, and 40. Preferably, the corners are tapered to about 450. The length of the surface created by the taper vary, depending upon the embodiment. According to preferred embodiments, the taper surface may be about $0.2\lambda/NA$.

The residual phase edges may also be manipulated by adding intermediate phase steps to the edges of conjugate phase regions to further reduce the impact of the residual phase edges. The intermediate steps may vary, depending upon the application. For example, the phase steps could be 45° steps. Accordingly, the phases could be about 90°–45°–0°. According to another embodiment, the phases may be about 270°–225°–180°–135°–90°–45°–0°, with a length of $0.5\lambda/NA$ for each step.

Once the mask design is finalized, it may be utilized in the integrated circuit production process.

Another example of the present invention is described below for producing a standard 0/180 phase shift mask with either a separate trim mask or with intermediate phase steps to hide residual phase edges. According to such a method, critical dimension feature edges are located as described above. The generic colorless phase shapes are also determined as described above.

Once the phase shapes have been determined, the present invention may then ensure that all edges of phase regions terminate on chrome as described above. Alternatively, this embodiment of the present invention may ensure that all edges of phase regions have sufficient space to a chrome edge to permit the safe placement of a residual phase edge removal feature(s) such as a trim mask or a phase gradient. Safe placement means that all designed and desired features are preserved in the structure created with the mask. Spacing to the chrome edges is described above.

Furthermore, the present invention may ensure that the edges have sufficient space to a phase gradient by creating fill shapes to occupy gaps smaller than specified widths between phase regions not over chrome and in between phase regions and neighboring non-critical chrome features. Again, sufficient spacing to the phase gradient is discussed above, as are the fill shapes. FIGS. 3–7 provide examples of the fill shapes, such as the tapered corners. Furthermore, the gaps size is discussed above. For example, the size of the gaps may depend upon the specific trim approach.

Next, this embodiment of the present invention assigns alternating phases to the phase regions created above. According to this embodiment, the phase regions are either 0° or 180° phase regions. Additionally, only the 180° phase regions will be utilized in the mask manufacturing process. The 0° regions are not needed since the entire background of the mask is 0° phase.

At this point, the present invention may once again, as described above, determine whether phase errors or areas where appropriate conditions cannot be met exist in the mask design.

Once errors have been detected, the embodiment of the present invention for creating a standard 0/180 phase shift mask may finalize the output by overlapping the phase regions onto the chrome regions in view of the mask house process involved.

Figure 7:
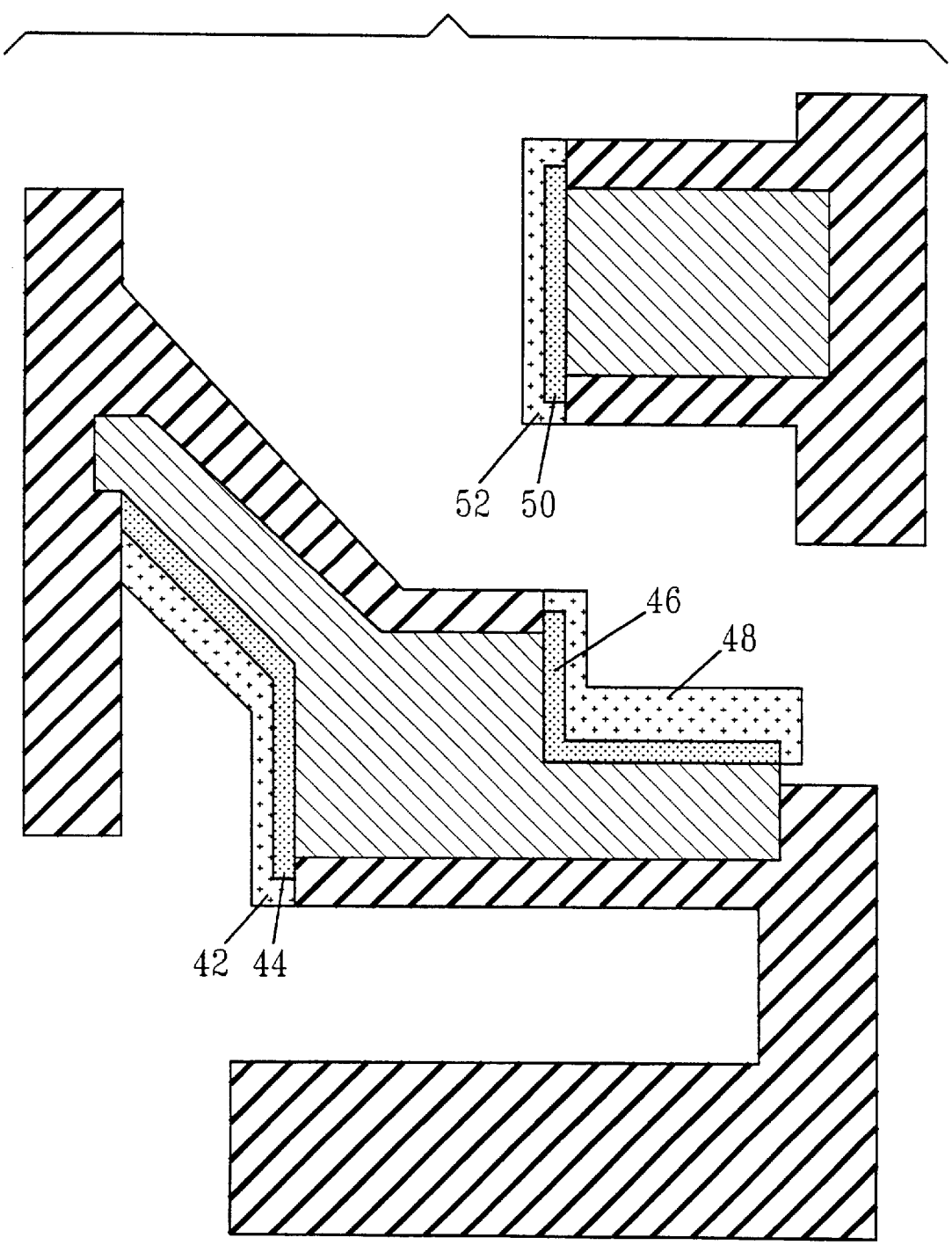
FIG. 7 represents a plan view of a mask design similar to those shown in FIGS. 1–6, however, rather than overlapping the phase-shifted regions onto chrome regions, the phase-shifted regions are selectively and repeatedly expanded.

FIG. 7 illustrates the overlapping of the phase regions onto the chrome regions.

The output may also be finalized by deriving designs for a trim mask by expanding residual phase edges not covered by chrome into shapes of a desired width. The width of a shape may depend upon the lithography process assumptions for the trim mask. The shapes may have widths of about $0.6\lambda/NA$.

FIG. 7 illustrates an example of expanding residual phase edges. The trim shapes preferably have sufficient width to print reliably and cover the residual phase edges under worst case overlap conditions.

Alternatively, the present invention may create phase gradient designs required for an intermediate phase step approach by selectively and repeatedly expanding the portions of the 180° phase shapes that are described above that are perpendicular to the residual phase edges. The amount that the 180° phase shapes perpendicular to the phase edges are expanded depends upon the embodiment. According to one embodiment, they are expanded by an amount defined by the following formula:

$$0.5 \times \lambda/NA.$$

In this formula, $\lambda$ is the wavelength of the radiation used to expose the material, such as photoresist, in forming the particular structure involved. NA represents the numerical aperture of the projection object utilized in the system transmitting the radiation to the mask and the structure being created.

According to one embodiment, the 180° phase shapes are expanded with two additional expansion areas having different phases. According to another embodiment, two additional expansions are included, one a 120° phase region and one a 60° phase region. According to still other embodiments, the expansions may include more intermittent phases. FIG. 7 shows an embodiment of the expansions 44, 46 and 50 bordering the phase shift regions As shown by the left hand overhanging portion of the region 42, 48, or 52 shown in FIG. 7, each shape may be turned into a staircase. Small pieces close to chrome regions may be ignored.

Once the output has been finalized, the mask may be utilized in the integrated circuit production process.

The present invention may also be utilized for creating dark field "alternating" phase shift masks. Such masks typically are utilized in the production of dynamic random access memory (DRAM). In a dark field phase shift mask the features in the mask requiring phase shifting are the minimum spaces between design features, rather than the features themselves. The present invention may identify features requiring phase shifting by locating all design features in the mask that fail a minimum spacing rules check. According to one embodiment, the minimum spacing is less than about $0.5\lambda/NA$.

Figure 8:
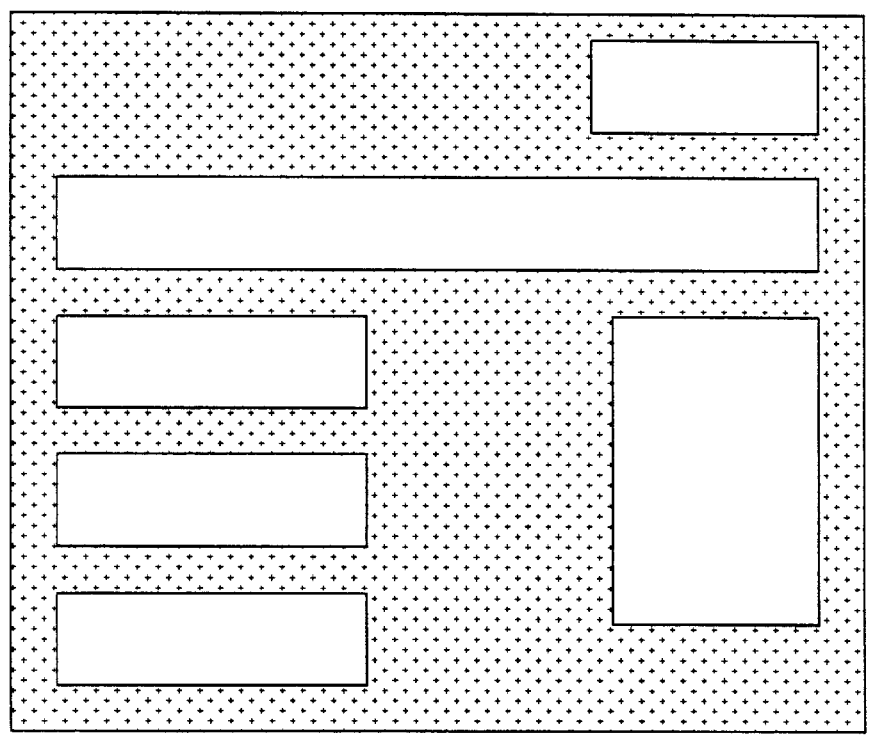
FIG. 8 represents a plan view of dark field alternating phase-shifted mask design.
Figure 9:
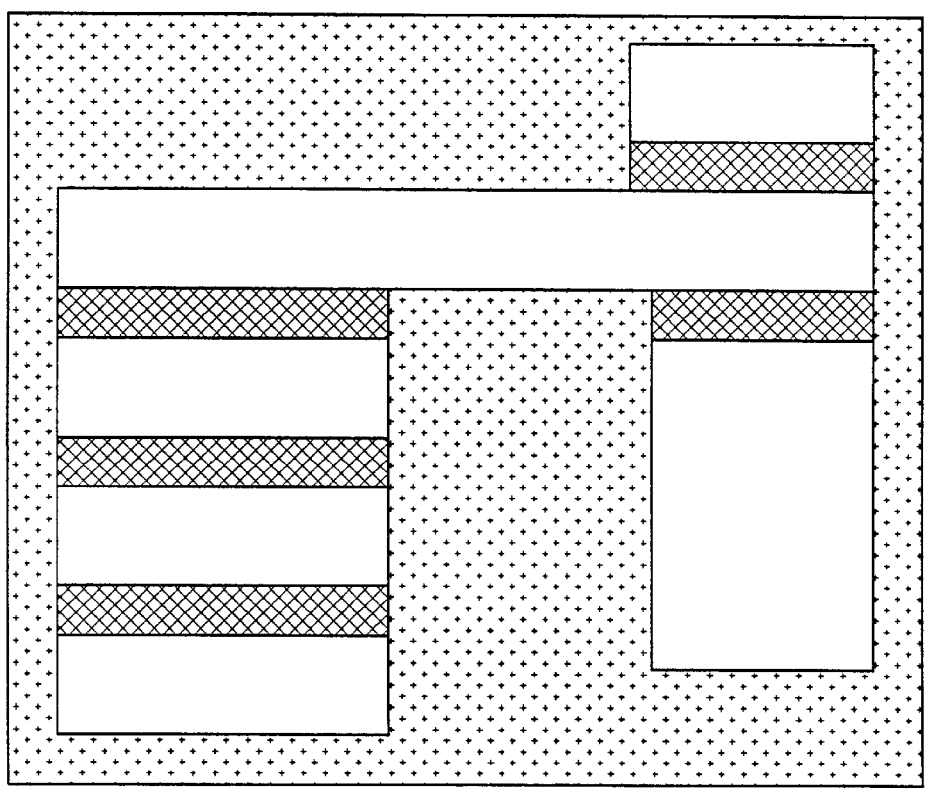
FIG. 9 represents a plan view of the mask design shown in FIG. 8 wherein spaces between design features that are separated by a predetermined minimum distance are identified.

FIG. 8 illustrates a dark field alternating phase shift mask. In FIG. 9, the features requiring phase shifting have been identified.

Once the features requiring phase shifting have been identified, the present invention may create generic phase regions on opposite sides of the features. The assigning of the phases to the dark field phase shift mask is simplified as compared to a bright field mask because the phases are assigned to designated features rather than to the background. Therefore, identification of features requiring phase shifting necessarily identifies generic phase regions, or un-phase shifted regions, as well.

Once generic phase regions are created, the present invention may ensure proper phase termination of all phase regions based upon space constraints of a given phase shift mask technique to be utilized with the mask. Different phase terminations require different amounts of space. Space constraints, distances between residual phase edges and other design features of the mask and other spacing issues are discussed above in greater detail.

Ensuring proper phase termination is complicated in dark field phase shift masks, especially in DRAM designs, because phase assignments starting at a point of minimum space violation are carried through the design feature in question across multiple levels of design hierarchy. In a dark field phase shift mask, phase termination may be provided by widening a feature by an sufficient amount to permit inclusion of a trim feature. According to one embodiment, a feature is widened sufficiently to contain phase gradients of a trim mask.

Alternatively, in a dark field phase shift mask, phase termination may be provided by adding a sufficient length of design that is not at a critical distance with respect to another design feature. Such a feature may be assigned a 0° phase in a conjugate twin-shifter approach.

Once proper phase termination has been ensured, the present invention preferably assigns phases to generic phase regions utilizing a net coloring approach. For a detailed description of this process, please see co-pending application filed Mar. 4, 1997, now U.S. patent application Ser. No. 08/810,844, now U.S. Pat. No. 5,883,813, for Automatic Generation of Phase Shift Masks Using Net Coloring, with the attorney docket number of FI9-96-084, the entire disclosure of which is hereby incorporated by reference. Phases are assigned with the minimum distance between features as the relevant intrusion. A goal of the coloring can be either to assign neighboring features 0° and 180° phase or 90° and 270° phase. Other phase assignments are possible, as discussed above. For example, the phases could be about n(90°) and about (n+2)90°.

Figure 10:
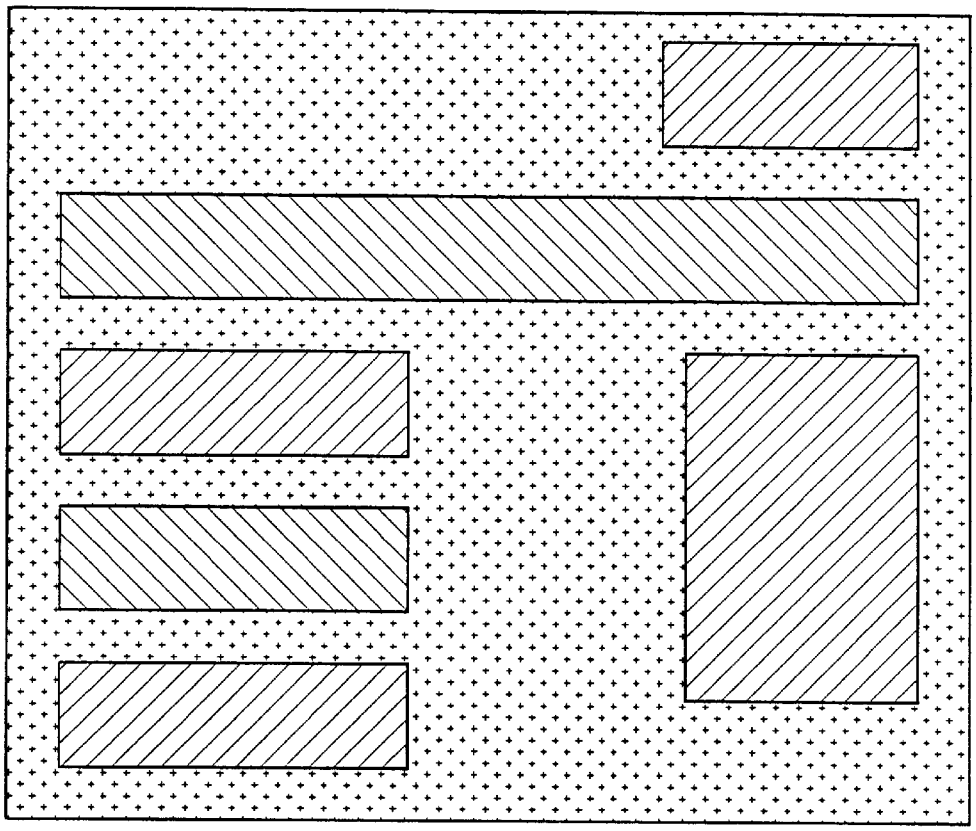
FIG. 10 represents a plan view of the mask design according to FIGS. 8 and 9 wherein phases have been assigned to the designed features.

Although the assignment of the phases is described herein as taking place after the phase termination, the phases are typically assigned prior to the phase termination process. FIG. 10 illustrates the assignment of phases to features in a dark field phase shift mask.

Once the phase termination and phase assignment have taken place, this embodiment of the present invention preferably designs data levels for mask manufacturing by applying mask process specific overlaps and expansions, as is know to those skilled in the art.

After preparing designed datalevels, this embodiment of the present invention preferably derives a residual phase edge image removal design. However, in some instances, dark field alternating phase shift masks may be designed without residual phase edges. Therefore, deriving a residual phase edge image removal design may not be necessary. If the process of the invention does include the residual phase edge removal design, it may include the processes described above including overlapping phase regions onto chrome regions, manipulating the phase edges as required by a specific exposure process, corners may be tapered, phase steps added to the edges of conjugate phase regions, the residual phase edges expanded, and selectively and repeatedly expanding phase shapes.

The present disclosure shows and describes only preferred embodiments of the present invention. As aforementioned, those reading the disclosure should understand that the invention may be used in other combinations and environments may be changed or modified within the scope of the inventive concept expressed herein.

We claim:

1. A process for creating and verifying a design of bright field and dark field phase-shifted masks capable of producing a provided chip design, said process utilizing at least one phase shift region employing a computer-aided design system, said process comprising the steps of:

a) locating features in a design of the bright field or dark field phase-shifted mask that require phase shifting, including locating edges of the features;

b) creating uncolored phase regions on opposite sides of the features by expanding the feature edges;

c) ensuring proper phase termination of said phase regions based upon space constraints of a phase-shifted mask technique utilized;

d) determining phases for said phase regions;

e) determining whether coloring errors and un-phase-shiftable design features exist;

f) applying mask process specific overlaps and expansions to prepare designed data levels for mask manufacture; and g) deriving a residual phase edge image removal design.

2. A process according to claim 1, further comprising the step of:

utilizing edge separation to locate said features of said mask design requiring phase shifting.

3. A process according to claim 1, further comprising the step of:

utilizing shapes-based operations to locate said features of said mask design requiring phase shifting.

4. The process according to claim 3, wherein said shapes based operations include a shrinking process followed by an expand process.

5. A process according to claim 1, further comprising the step of:

utilizing an expansion of said features; and differencing said features with the original features, thereby creating phase regions.

6. A process according to claim 1, further comprising the step of:

utilizing a design system to design and color two distinct phase regions to design a phase shift mask with three phase regions by ensuring that unoccupied background on the phase shift mask is wide enough to act as a functional 0° phase.

7. A process according to claim 1, further comprising the step of:

designing and coloring shape on both sides of a feature so as to produce 180° phase transition across a critical feature while minimizing the impact of residual phase edges.

8. The process according to claim 1, wherein said residual phase edge image removal design is accomplished by a trim mask pattern or a phase gradient.

9. The process according to claim 1, wherein the mask is a mask selected from the group consisting of a bright field conjugate twin-shifter phase shift mask, a 0°/180° phase-shift mask, and a dark field alternating phase-shift mask.

10. A process for creating and verifying a design of bright field and dark field phase-shifted masks utilizing at least one phase shift region employing a computer-aided design system, said process comprising the steps of:

a) determining feature edges that define portions of a design of the bright field or dark field phase-shifted mask that require phase shifting based upon the width of the feature relative to a resolution of an exposure tool;

b) outwardly projecting the feature edges by a predetermined amount to derive a set of colorless phase regions;

c) creating fill shapes to occupy gaps smaller than a predetermined width between phase regions not over chrome or between phase regions of neighboring non-critical chrome features;

d) determining whether coloring errors and un-phase-shiftable design features exist;

e) assigning phases to the phase regions.

11. The process according to claim 10, wherein said feature edges are outwardly projected by an amount approximately equal to the value of the formula:

$$k\lambda/NA,$$

wherein k is a factor with a value of from about 0.5 to about 0.8 related to how well a combined lithograph system can utilize a theoretical resolution limit, $\lambda$ is the wavelength of the radiation to be utilized with a mask produced according to the process, NA is the numerical aperture of the projection optics utilized with the mask.

12. The process according to claim 10, wherein said feature edges are outwardly projected by an amount approximately equal to the value of the formula:

$$k\lambda/NA,$$

wherein k is a factor with a value of less than about 0.6 related to how well a combined lithograph system can utilize a theoretical resolution limit, $\lambda$ is the wavelength of the radiation to be utilized with a mask produced according to the process, NA is the numerical aperture of the projection optics utilized with the mask.

13. The process according to claim 10, wherein step c results in all edges of phase regions terminating either on chrome or having sufficient width of un-phase shifted region adjacent to them to minimize a transmission reduction at a residual phase edge.

14. The process according to claim 10, wherein step c results in all edges of phase regions terminating either on chrome or having sufficient space between phase regions and a chrome edge to permit safe placement of a residual phase edge elimination approach.

15. The process according to claim 10, wherein touching phase regions or closely approaching phase regions are assigned substantially the same phase, and phase regions on opposite sides of said critical dimension features are assigned opposite phases.

16. The process according to claim 10, wherein said phase regions are assigned opposite phases.

17. The process according to claim 10, wherein said mask includes three separate phase regions in addition to chrome images.

18. The process according to claim 10, wherein said mask is utilized with a separate trim mask or with intermediate phase steps to hide residual phase edges.

19. The process according to claim 10, further comprising the steps of:

determining locations on said mask where phase errors where appropriate conditions cannot be met;

overlapping said phase regions on to said chrome regions in accordance with a maskhouse that the mask is to be utilized with; and manipulating residual phase edges in accordance with an exposure process to be utilized with the mask.

20. The process according to claim 10, wherein said overlapping and manipulating include tapering square corners in residual phase edges to prevent abnormalities in an out-of-focus conditions or adding intermediate phase steps to the edges of conjugate phase regions to further reduce the impact of the residual phase edges.

21. The process according to claim 10, further comprising the steps of:

determining locations on said mask where phase errors will occur and where appropriate conditions cannot be met;

overlapping said phase regions onto said chrome regions in accordance with a maskhouse that the mask is to be utilized with; and deriving design data levels for a trim mask by expanding residual phase edges not covered by chrome into shapes of a desired width or by creating phase gradient designs required for the intermediate phase step approach by selectively and repeatedly expanding 180° phase shapes perpendicular to the residual phase edges by an appropriate amount.

22. The process according to claim 21, wherein said amount is defined by the formula:

$$k\lambda/NA,$$

wherein k is a factor with a value of from about 0.5 to about 0.8 related to how well a combined lithograph system can utilize a theoretical resolution limit, $\lambda$ is the wavelength of the radiation to be utilized with a mask produced according to the process, NA is the numerical aperture of the projection optics utilized with the mask.

23. The process according to claim 21, wherein said residual phase edges are expanded dependent upon the lithography process and parameters to be utilized with the mask.

24. The process according to claim 21, wherein said phase gradient designs utilizes 180/120/60/0° phases requiring two additional expansions for the 120° and 60° phase regions.

25. A process for creating a dark field alternating phase shift mask, comprising the steps of:

identifying features in the mask that require phase shifting;

creating generic phase regions on opposite sides of the features that require phase shifting;

assigning phases to said generic phase regions utilizing a net coloring approach and based upon minimum space between features;

ensuring proper phase termination of all phase regions; and preparing designed datalevels for mask manufacturing by applying mask process specific overlaps and expansions.

26. The method according to claim 25, further comprising the step of:

creating a residual phase edge image removal design.

27. The method according to claim 25, wherein said features requiring phase shifting are between design features.

28. The method according to claim 25, wherein said features are between design features that are separated by less than a predetermined distance.

29. The method according to claim 25, wherein said phase termination is provided by widening a design feature that requires phase shifting and providing a trim feature adjacent said design feature.

30. The method according to claim 25, wherein said phase termination is provided by a length of a design feature that is not at critical space to another design and does not need to be phase shifted, said length of said design feature being assigned a 0° phase.

31. The method according to claim 25, wherein said phases are assigned to said generic phase regions such that neighboring features are assigned 0° and 180° phase or 90° and 270° phase.

32. A phase shifted mask prepared by a process comprising the steps of:

a) locating features in a design of the bright field or dark field phase-shifted mask that require phase shifting, including locating edges of the features;

b) creating uncolored phase regions on opposite sides of the features by expanding the feature edges;

c) ensuring proper phase termination of said phase regions based upon space constraints of a phase-shifted mask technique utilized;

d) determining phases for said phase regions;

e) determining whether coloring errors and un-phase-shiftable design features exist;

f) applying mask process specific overlaps and expansions to prepare designed data levels for mask manufacture; and g) deriving a residual phase edge image removal design.

* * * * *